(12) United States Patent
Kim et al.

(10) Patent No.: US 8,004,891 B2
(45) Date of Patent: Aug. 23, 2011

(54) MEMORY DEVICE AND METHOD OF PROGRAMMING THEREOF

(75) Inventors: Yong June Kim, Seoul (KR); Kyoung Lae Cho, Yongin-si (KR); Jae Hong Kim, Seoul (KR); Jun Jin Kong, Yongin-si (KR); Hong Rak Son, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 251 days.

(21) Appl. No.: 12/453,964

(22) Filed: May 28, 2009

(65) Prior Publication Data

US 2010/0020620 A1    Jan. 28, 2010

(30) Foreign Application Priority Data

Jul. 23, 2008  (KR) .................. 10-2008-0071647

(51) Int. Cl.
*G11C 16/04* (2006.01)

(52) U.S. Cl. ......... 365/185.03; 365/185.18; 365/185.24; 365/189.05; 341/58; 341/59

(58) Field of Classification Search .......... 365/189.05, 365/185.24, 185.18, 185.03
See application file for complete search history.

(56) References Cited

U.S. PATENT DOCUMENTS

| 5,987,066 | A | 11/1999 | Kojima et al. |
| 6,751,144 | B2 * | 6/2004 | Takahashi et al. ............ 365/222 |
| 7,098,818 | B1 | 8/2006 | Sawada et al. |
| 7,436,331 | B1 * | 10/2008 | Chaichanavong et al. ...... 341/59 |
| 2005/0122786 | A1 * | 6/2005 | Antonakopoulos et al. ........................ 365/189.05 |
| 2005/0166130 | A1 | 7/2005 | Coene et al. |
| 2010/0202198 | A1 * | 8/2010 | Kim et al. ................. 365/185.03 |
| 2010/0332737 | A1 * | 12/2010 | Yoo et al. ..................... 711/103 |

FOREIGN PATENT DOCUMENTS

| JP | 09-102747 | 4/1997 |
| JP | 2005-018439 | 1/2005 |

* cited by examiner

*Primary Examiner* — Linh V Nguyen

(74) *Attorney, Agent, or Firm* — Harness, Dickey & Pierce, P.L.C.

(57) ABSTRACT

Example embodiments may provide a memory device and memory data programming method. The memory device according to example embodiments may encode a first data page to generate at least one first codeword and encode a second data page to generate a second codeword. The memory device may generate the first codeword with at least one of a maximum value of a number of successive ones and a second maximum value of a number of successive zeros. The memory device may program the at least one first codeword and the at least one second codeword to a plurality of multi-bit cells.

19 Claims, 10 Drawing Sheets

FIG. 4

|  | CELL 1 | CELL 2 | CELL 3 | CELL 4 | CELL 5 | CELL 6 | CELL 7 | CELL 8 | CELL 9 |
|---|---|---|---|---|---|---|---|---|---|
| MSB | 1 | 1 | 0 | 1 | 0 | 0 | 1 | 1 | 0 |
| LSB | 1 | 1 | 1 | 1 | 1 | 0 | 0 | 0 | 1 |
| STATE | P0 | P0 | P3 | P0 | P3 | P2 | P1 | P1 | P2 |

FIG. 5

| INPUT DATA | CODED DATA |
|---|---|
| 000 | 00000 |
| 001 | 00001 |
| 010 | 00010 |
| 011 | 00100 |
| 100 | 00101 |
| 101 | 01000 |
| 110 | 01001 |
| 111 | 01010 |

FIG. 6

|  | CELL 1 | CELL 2 | CELL 3 | CELL 4 | CELL 5 |
|---|---|---|---|---|---|
| MSB | 0 | 1 | 0 | 0 | 1 |
| LSB | 0 | 1 | 0 | 1 | 0 |
| STATE | P2 | P0 | P2 | P3 | P1 |

FIG. 7

| INPUT DATA | CODED DATA |
|---|---|
| 0000 | 11001 |
| 0001 | 11011 |
| 0010 | 10010 |
| 0011 | 10011 |
| 0100 | 11101 |
| 0101 | 10101 |
| 0110 | 10110 |
| 0111 | 10111 |
| 1000 | 11010 |
| 1001 | 01001 |
| 1010 | 01010 |
| 1011 | 01011 |
| 1100 | 11110 |
| 1101 | 01101 |
| 1110 | 01110 |
| 1111 | 01111 |

FIG. 8

|  | CELL 1 | CELL 2 | CELL 3 | CELL 4 | CELL 5 | CELL 6 | CELL 7 | CELL 8 | CELL 9 | CELL 10 |
|---|---|---|---|---|---|---|---|---|---|---|
| MSB | 0 | 1 | 1 | 0 | 1 | 1 | 0 | 0 | 1 | 1 |
| LSB | 0 | 1 | 1 | 1 | 1 | 1 | 1 | 0 | 1 | 0 |

FIG. 9

|       | CELL 1 | CELL 2 | CELL 3 | CELL 4 | CELL 5 | CELL 6 | CELL 7 | CELL 8 | CELL 9 | CELL 10 |
|-------|--------|--------|--------|--------|--------|--------|--------|--------|--------|---------|
| MSB   | 1      | 0      | 0      | 1      | 0      | 0      | 1      | 1      | 0      | 0       |
| LSB   | 1      | 0      | 0      | 0      | 0      | 0      | 0      | 1      | 0      | 1       |
| STATE | P0     | P2     | P2     | P1     | P2     | P2     | P1     | P0     | P2     | P3      |

US 8,004,891 B2

MEMORY DEVICE AND METHOD OF PROGRAMMING THEREOF

PRIORITY STATEMENT

This application claims priority under 35 U.S.C. §119 to Korean Patent Application No. 2008-0071647, filed on Jul. 23, 2008 in the Korean Intellectual Property Office (KIPO), the entire contents of which are incorporated herein by reference.

BACKGROUND

1. Field

Example embodiments may relate to a method and device of programming data to a memory device. For example, example embodiments may relate to a method and a device for programming data to a memory device that stores data by changing a threshold voltage of a memory cell.

2. Description of Related Art

A non-volatile semiconductor memory, one of various storage mediums that may maintain stored data even when power is out, is widely used. One representative non-volatile memory is a flash memory, and the flash memory has advantages of a smaller size, less power consumption, and higher reading rate compared to a conventional Hard Disk Drive (HDD). Recently, Solid State Disks (SSD) that use flash memory for mass storage have been suggested as replacements for HDD.

Representative flash memories may be a NAND flash memory, a NOR flash memory, and the like. A method based on NAND and a method based on NOR may be discriminated by a cell array configuration and operation method.

The flash memory is composed of an arrangement of a plurality of memory cells and a single memory cell may store at least one data bit. The single memory cell includes a control gate and floating gate. Also, an insulator insulates between the control gate and floating gate, and another insulator insulates between the floating gate and a substrate.

An operation of storing data to the memory cell of the flash memory is called programming and an operation of erasing a program or data is performed by a hot carrier effect or Fowler-Nordheim Tunneling (F-N tunneling) mechanism.

SUMMARY

According to example embodiments, a memory device may include a memory cell array including a plurality of multi-bit cells, an encoder configured to encode a first data page for generating at least one first codeword with at least one of a first maximum value of a number of successive ones and a second maximum value of a number of successive zeros, and to encode a second data page for generating at least one second codeword, and a programming unit configured to program the at least one first codeword and the at least one second codeword to the plurality of multi-bit cells.

According to example embodiments, a method of programming memory data include encoding a first data page to generate at least one first codeword with at least one of a first maximum value of a number of successive ones and/or a second maximum value of a number of successive zeros, encoding a second data page to generate at least one second codeword, and programming the at least one first codeword and the at least one second codeword to a plurality of multi-bit cells.

In example embodiments, there may be provided a method to reduce a width of a distribution of threshold voltages of a plurality of memory cells. Accordingly, errors occurring when data is read from the plurality of cells may be reduced.

In example embodiments, there may be provided a method to reduce lateral charge spreading between a plurality of neighboring memory cells. Accordingly, a probability of contaminating data stored in a memory cell may be reduced.

In example embodiments, there may be provided suitable reference information to a phase locked loop (PLL). Accordingly, errors occurring when data is transmitted may be reduced.

Additional aspects, features, and/or advantages of example embodiments will be set forth in part in the description which follows and, in part, will be apparent from the description and/or may be learned by practice of example embodiments.

BRIEF DESCRIPTION OF THE DRAWINGS

The above and other features and advantages of example embodiments will become more apparent by describing in detail example embodiments with reference to the attached drawings in which:

FIG. 4 illustrates an example of data that is not yet encoded by the memory device of FIG. 1;

FIG. 5 illustrates an example of a Run Length Limited (RLL) code used when encoding is performed by the memory device of FIG. 1;

FIG. 6 illustrates an example of a codeword generated by the memory device 100 of FIG. 1 that encodes the data of FIG. 4;

FIG. 7 illustrates another example of an RLL code used when encoding is performed by the memory device of FIG. 1;

FIG. 8 illustrates another example of a codeword generated by the memory device 100 of FIG. 1 that encodes the data of FIG. 4;

FIG. 9 illustrates an example of a codeword of FIG. 8 flipped by the memory device of FIG. 1.

DETAILED DESCRIPTION OF EXAMPLE EMBODIMENTS

Figure 1:
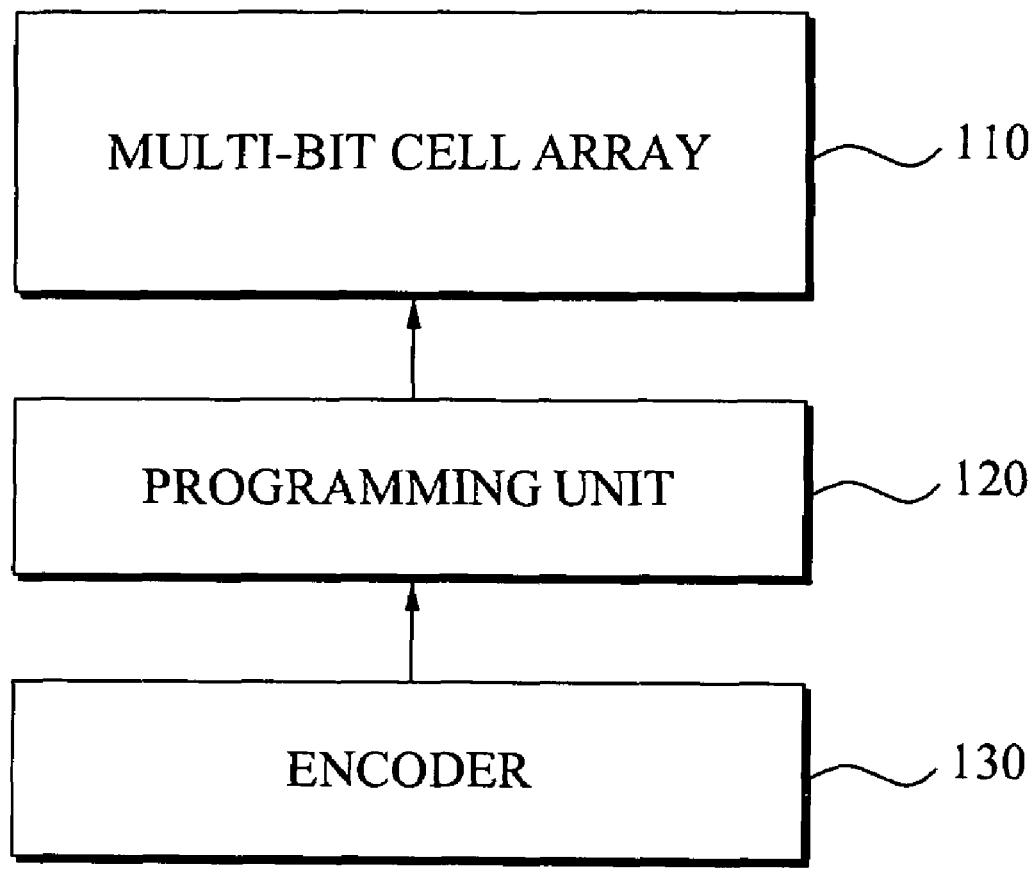
FIG. 1 illustrates a memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein. The accompanying drawings are not to be considered as drawn to scale unless explicitly noted.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments may be applicable to a memory device that stores data by changing a threshold voltage of a memory cell. Examples of the memory device may include a flash memory, Electrically Erasable Programmable Read Only Memory (EEPROM), Phase Shift Random Access Memory (PRAM), Magnetic Random Access Memory (MRAM), and the like.

A memory cell of a non-volatile memory device may be classified into a single level cell and multi-level cell according to a density of data to be stored.

The single-level cell (SLC) may be a memory that stores one bit data to a single memory cell. The SLC may also be called as a single-bit cell (SBC). A process that stores data to a memory cell (single-level cell) of a SLC memory may also be called a program process and may change threshold voltage of the memory cell. For example, when data with a logic value "1" is stored in the SLC, the SLC may have a 1.0 V threshold voltage, and when data with a logic value "0" is stored in the SLC, the SLC may have a 3.0 V threshold voltage.

A threshold voltage of each SLC where the same data is programmed may have a certain range of distribution due to a minute electric characteristic difference between the SLCs. For example, when a voltage read from the memory cell is 0.5 to 1.5 V, the data stored in the memory cell may have a logic "1" and when the voltage read from the memory cell is 2.5 V to 3.5 V, the data stored in the memory cell may have a logic "0". The data stored in the memory cell may be discriminated according to an electric current/voltage difference of the memory cell when sensing.

A multi-level cell (MLC) memory may program two or more bit data in a single memory cell. The MLC memory may also be referred to as a multi-bit cell (MBC) memory. Since the MLC may increase a density of data to be stored, the MLC may have a relatively larger memory capacity compared to the SLC. However, as the number of bits stored in the single memory cell increases, reliability may deteriorate and a read-failure rate may increase. When m-bit data is programmed to the single memory cell, one of $2^m$ threshold voltages may be formed in the memory cell. Threshold voltages of memory cells having the same type of data programmed may have a certain distribution range due to a minute electric characteristic difference between the memory cells. In this instance, each of the threshold voltages may respectively correspond to one of $2^m$ data values that may be generated through m bits.

However, since a voltage window of the memory may be limited, as m increases, a distance between $2^m$ distributions of thresholds voltages of neighboring bits may decrease. As the distance decreases, the neighboring distributions may be overlapped. When the neighboring distributions overlap with each other, the read-failure rate may increase.

Example embodiments may be applicable to a charge trap memory including a multi-bit cell. A memory cell of the charge trap memory may include a charge trap site which is located between a gate terminal and channel. A threshold of the memory cell may be determined according to an amount of an electric charge charged to the charge trap site.

The electric charge charged to the charge trap site may be moved in parallel to the channel and a location or amount of the electric charge charged to the charge trap site may be affected by an electric force that works on the electric charge stored in charge trap sites of memory cells adjacent to the charge trap memory. Since data stored in the charge trap memory has a probability to be contaminated over time through the above-described mechanism, a method or a device for effectively correcting a read error may be required when the charge trap memory is maintained data for a long time.

The memory cell may include a gate terminal composed of metal or poly-silicon. The memory cell may also include a floating gate (FG) between the gate terminal and channel. The floating gate may be composed of metal or poly-silicon.

The memory cell of the charge trap memory may include a charge trap site between the gate terminal and channel. The charge trap site may be an insulating layer. The charge trap site may have permittivity greater than that of a first insulating layer existing between the gate terminal and channel.

For example, the first insulating layer composed of a silicon oxide may exist between the gate terminal and channel and the charge trap site may be an insulating layer composed of silicon nitride. In this instance, the silicon oxide layer may exist between the gate terminal and silicon nitride layer, and the silicon oxide layer may exist between the silicon nitride and channel. When the charge trap site is composed of the insulating layer, it may be referred to as a charge trap layer.

A method for storing data to the charge trap memory according to the example embodiments may change a threshold of a memory cell by charging electric charge to a charge trap layer or discharging electric charge from the charge trap layer. The method for storing data may be called a program. In this instance, the electric charge charged to the charge trap layer may move within the charge trap layer by an electric field formed between a gate terminal and channel of the memory cell.

FIG. 1 illustrates a memory device 100 according to example embodiments.

Referring to FIG. 1, the memory device 100 includes a memory cell array 110, programming unit 120, and an encoder 130.

The memory cell array 110 may include a plurality of multi-bit cells. A program process that stores data to the multi-bit cell may consume more time than a process that reads data from the multi-bit cell. Accordingly, the memory device 100 may simultaneously perform the program process with respect to more than one multi-bit cell.

A set of multi-bit cells that is programmed simultaneously may be called a page. A set of data that is simultaneously programmed may be called a data page.

As the memory device 100 may store m-bit data to a single multi-bit cell, m data pages may be programmed to a single page.

The encoder 130 may encode a first data page to generate at least one codeword. For example, the encoder 130 may generate at least one first codeword with at least one of a first maximum value of a number of successive ones (1) and a second maximum value of a number of successive zeros (0).

The encoder 130 may encode a second data page to generate at least one second codeword.

The programming unit 120 may program the at least one first codeword and the at least one second codeword to a single page.

Depending on example embodiments, the programming unit 120 may program the at least one first codeword to the page, and then program the at least one second codeword to the page. Alternatively, the programming unit 120 may program the at least one second codeword to the page, and then program the at least one first codeword to the page.

Referring to FIG. 1, the encoder 130 may encode the first data page, and thereby may generate the at least one first codeword with at least one of a first minimum value of a number of successive ones and the second maximum value of a number of successive zeros.

The memory device 100 may set a maximum value of a number of successive ones or a maximum value of a number of successive zeros included in the first data page. Accordingly, the memory device 100 may limit the number of successive ones or the number of successive zeros in the first data page to be less than or equal to the maximum value.

In the process that the memory device 100 reads data from the memory cell array 110 and outputs the read data, a Phase Locked Loop (PLL) may be used. In general, the PLL may sense a moment that data value changes from zero to one or from one to zero and may synchronize a phase of the data. The memory device 100 may limit a number of successively outputted zeros or a number of successively outputted ones, and thereby may frequently provide reference information that the PLL may sense. Accordingly, the memory device 100 may reduce errors occurring when a high-speed PPL is operated and may output data in high-speed.

An encoding scheme using a Run Length Limited (RLL) code may be one of various encoding schemes used in the process where the memory device 100 generates the first codeword with a maximum value of the number of successive ones, a maximum value of the number of successive zeros, a minimum value of the number of successive ones or a minimum value of the number of successive zeros.

As an example of the RLL code, (d, k) code is an RLL code with d as a minimum value of a number of zeros between two ones and with k as a maximum value of a number of zeros between two ones.

According to example embodiments, the encoder 130 may instead divide the second data page to generate a plurality of second codewords. In this instance, the encoder 130 may generate a plurality of second codewords without applying the encoding scheme using the RLL code to the second data page. Since the encoder 130 does not apply the encoding scheme using the RLL code to the second data page, a code rate related to the first and second codeword may increase.

According to example embodiments, the encoder 130 may encode the second data page to generate the at least one second codeword with at least one of a third maximum value of a number of successive ones and a fourth maximum value of a number of successive zeros. In this instance, the encoder 130 may apply the encoding scheme using the RLL code to the second data page to generate the at least one second codeword.

According to example embodiments, the encoder 130 may also flip the at least one first codeword to generate the at least one third codeword. In this instance, the programming unit 120 may program the at least one third codeword and the at least one second codeword to a single page. In this case, the programming unit 120 may program the at least one third codeword to the page instead of the at least one first codeword.

According to example embodiments, the encoder 130 may perform symbolic operation according to a memory cell. For example, in the case of 2-bit multi-bit cell, a 4-ary (Quaternary) symbol may be generated by combining information of the first data page and the second data page stored in a single cell. In the case of an m-bit multi-bit cell, a $2^m$-ary symbol may be generated by combining information of m data pages stored in a single cell. In this instance, a codeword may be generated by a symbol by applying the $2^m$-ary RLL code.

Figure 2:
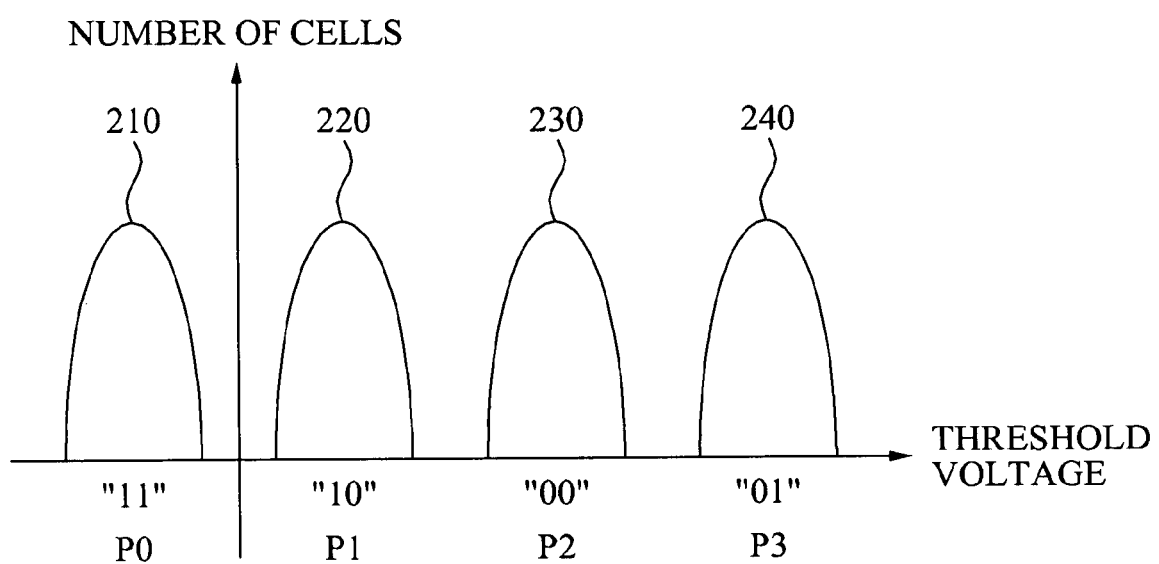
FIG. 2 illustrates an example of distributions of threshold voltages of a plurality of multi-bit cells that are programmed by the memory device of FIG. 1.

FIG. 2 illustrates an example of distributions of threshold voltages of a plurality of multi-bit cells that are programmed by the memory device 100 of FIG. 1.

Referring to FIG. 2, a number of multi-bit cells corresponding to a threshold voltage is illustrated.

A distribution 210 indicates a distribution of threshold voltages of a plurality of multi-bit cells where data "11" is programmed. The data "11" may be represented as a Most Significant Bit (MSC) "1," and as Least Significant Bit (LSB) "1". The distribution 210 may be called a program state P0.

A distribution 220 indicates a distribution of threshold voltages of a plurality of multi-bit cells where data "10" is programmed. The data "10" may be represented as a MSB "1" and a LSB "0". The distribution 220 may be called a program state P1.

A distribution 230 indicates a distribution of threshold voltages of a plurality of multi-bit cells where data "00" is programmed. The data "00" may be represented as a MSB "0" and a LSB "0". The distribution 230 may be called a program state P2.

A distribution 240 indicates a distribution of threshold voltages of a plurality of multi-bit cells where data "01" is programmed. The data "01" may be represented as MSB "0" and LSB "1". The distribution 240 may be called a program state P3.

The memory device 100 may select one bit from among the first codeword and determine the selected bit as a LSB. The memory device 100 may select one bit from among the second codeword and determine the selected bit as a MSB. The memory device 100 may determine a target threshold voltage based on a combination of the MSB and LSB. The memory device 100 may change a threshold voltage of a multi-bit cell based on the target threshold voltage.

Alternatively, the memory device 100 may select one bit from among the first codeword and determine the selected bit as a MSB, and select one bit from among the second codeword and determine the selected bit as a LSB.

According to example embodiments of the memory device 100, a multi-bit cell may store m-bit data. In this instance, the memory device 100 may program m data pages to a single page. The memory device 100 may select two data pages from among m data pages and determine the selected data pages respectively as a first data page and a second data page.

When the multi-bit cell includes a charge trap site, the memory device 100 may electrically charge the charge trap site or discharge the charge trap site, thereby changing a threshold of the multi-bit cell.

Figure 3:
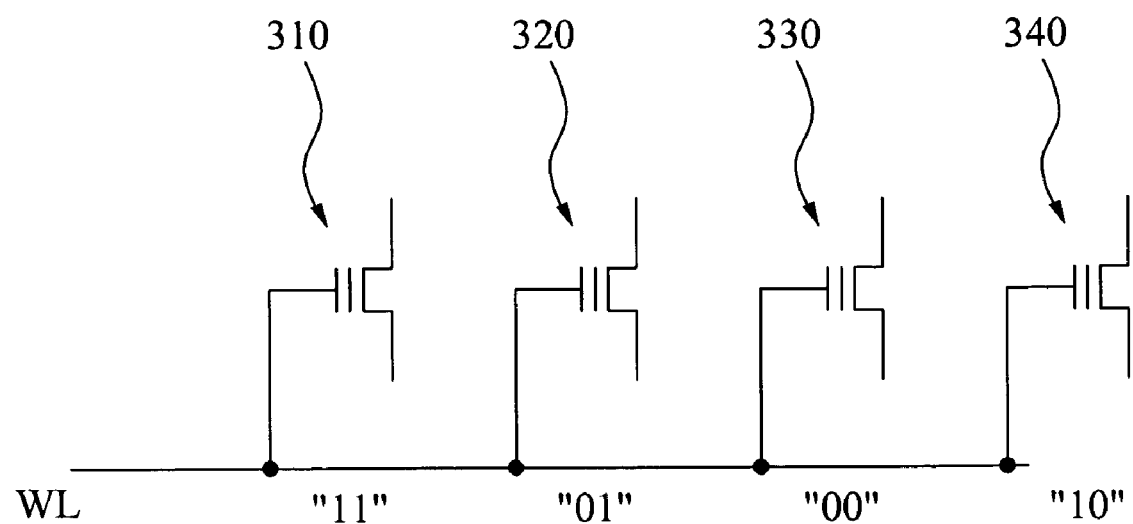
FIG. 3 illustrates an example of lateral charge spreading.

FIG. 3 illustrates an example of lateral charge spreading.

Referring to FIG. 3, four multi-bit cells 310 to 340 may be connected to a word line (WL).

The memory device 100 may transmit a program voltage to gate terminals of the four multi-bit cells via the WL.

Data to be programmed to the multi-bit cell 310 may be represented as "11". Data to be programmed to the multi-bit cell 320 may be represented as "01". Data to be programmed to the multi-bit cell 330 may be represented as "00". Data to be programmed to the multi-bit cell 340 may be represented as "10".

The data "11" may correspond to the program state P0. The data "01" may correspond to the program state P3. Since a strong electric field may form between charge trap sites of the multi-bit cell 310 and multi-bit cell 320, there may be a higher probability that lateral charge spreading occurs.

The memory device 100 may encode data of FIG. 3 to reduce lateral charge spreading between neighboring multi-bit cells.

An example of an encoding process of the memory device 100 will be described below with reference to FIGS. 4 to 9.

FIG. 4 illustrates an example of data that is not yet encoded by the memory device 100 of FIG. 1.

Referring to FIG. 4, for convenience of description, when a data page corresponding to an MSB is assumed to be a second data page, the second data page may have a value "110100110". When a data page corresponding to a LSB is assumed to be a first data page, the first data page may have a value "111110001".

Data to be stored to a virtual cell 1 may be an MSB "1" and LSB "1" and a program state to be formed to the cell 1 may be P0. In the same manner, a program state to be formed to a virtual cell 2 may be P0 and a program state to be formed to a cell 3 may be P3.

Program states to be formed to cells 4 to 9 may be P0, P3, P2, P1, P1, and P2, respectively.

In this instance, since the program state P0 and P3 are formed at the neighboring cells 2 and 3, there may be a high probability that lateral charge spreading occurs. Referring to FIG. 4, there three instances of program states P0 and P3 being formed at neighboring cells.

The memory device 100 may encode the first data page, and thereby may reduce a probability of occurrence of the P0 and P3 in the neighboring cells. Accordingly, the memory device 100 of FIG. 1 may reduce a probability of occurrence of the lateral charge spreading between the neighboring cells.

FIG. 5 illustrates an example of an RLL code used when encoding is performed by the memory device 100 of FIG. 1. Referring to FIG. 5, an example of a $(1, \infty)$ RLL code is illustrated.

The $(1, \infty)$ RLL code may be a code that requires a number of zeros between ones to be equal to or more than one and does not limit a number of successive zeros. Thus, there are no successive ones in the $(1, \infty)$ RLL code.

In FIG. 5, the memory device 100 may divide a bit stream of the first data page by three-bits. The memory device 100 may encode an input bit stream "000" to generate a codeword "00000".

The memory device 100 may respectively encode input bit streams "001", "010", "011", "100", "101", "110", and "111" to respectively generate codewords "00001", "00010", "00100", "00101", "01000", "01001", and "01010".

In this instance, since each five-bit codeword includes three bits of effective information, a code rate may be ⅗ or 0.6.

FIG. 6 illustrates an example of a codeword generated by the memory device 100 of FIG. 1 that encodes the data of FIG. 4.

The memory device 100 may encode "110" from among the bit streams of the MSB of FIG. 4 to generate a codeword "01001". The memory device 100 may encode "111" from among the bit streams of the LSB of FIG. 4 to generate a codeword "01010".

The memory device 100 may form program states to multi-bit cells 1 to 5 based on the generated codewords.

In cell 1, since an MSB "0" and an LSB "0" are stored, a program state P2 may be formed. In cell 2, since an MSB "1" and LSB "1" are stored, a program state P0 may be formed.

In the same manner, in cells 3 to 5, program states P2, P3, and P1 may be respectively formed. Compared to FIG. 4, occurrence of program states P0 and P3 in neighboring cells is eliminated in FIG. 6.

Thus, the memory device 100 may reduce a probability that a strong electric field is formed in neighboring cells. Accordingly, the memory device 100 may reduce a probability of lateral charge spreading in the neighboring cells. The memory device 100 may also reduce a probability that a threshold of a multi-bit cell changes over time. The memory device 100 may reduce a width of a distribution of threshold voltages of a plurality of multi-bit cells.

When the memory device 100 generates a threshold voltage of a multi-bit cell based on a codeword as described in the example embodiment of FIG. 2, the memory device 100 uses the $(1, \infty)$ RLL code in an encoding process. Thus, a probability that P0 and P3 are formed in neighboring cells becomes zero.

FIGS. 4 to 6 illustrate a method to reduce lateral charge spreading. However, since a code rate is 0.6, overhead with respect to a storage space is relatively large. FIGS. 7 to 9 illustrate example embodiments that may reduce the lateral charge spreading and also relatively increase the code rate.

FIG. 7 illustrates another example of an RLL code used when encoding is performed by the memory device 100 of FIG. 1. Referring to FIG. 7, an example of a (0, 2) RLL code is illustrated.

The (0, 2) RLL code is a RLL code that limits a number of zeros between two ones to less than or equal to two, and does not limit a number of successive ones.

Referring to FIG. 7, the memory device 100 may divide an input data page to generate four-bit input bit streams.

The memory device 100 may encode an input bit stream "0000" to generate a codeword "11001". The memory device 100 may respectively encode input bit streams "0001", "0010", "0011", "0100", "0101", "0110", "0111", "1000", "1001", "1010", "1011", "1100", "1101", "1110", and "1111" to respectively generate codewords "11011", "10010", "10011", "11101", "10101", "10110", "10111", "11010", "01001", "01010", "01011", "11110", "01101", "01110", and "01111".

The memory device 100 may limit a number of successive zeros to be less than or equal to two, and thereby may generate reference information of a PLL. The memory device 100 may reduce errors occurring when the PLL is operated in high-speed.

FIG. 8 illustrates another example of a codeword generated by the memory device 100 of FIG. 1 that encodes the data of FIG. 4.

The memory device 100 may generate an input bit stream "1101" with using a first four bits of the MSB of FIG. 4. The memory device 100 may generate an input bit stream "0011" using a second four bits of the MSB of FIG. 4.

The memory device 100 may generate an input bit stream "1111" using a first four bits of the LSB of FIG. 4. The memory device 100 may generate an input bit stream "1000" using a second four bits of the LSB of FIG. 4.

Referring to FIG. 8, The memory device 100 may encode the input bit stream "1101" to generate a codeword "01101", encode the input bit stream "0011" to generate a codeword "10011," encode the input bit stream "1111" to generate a codeword "01111", and encode the input bit stream "1000" to generate a codeword "11010".

The memory device 100 may generate the codewords "01101" and "10011" corresponding to the MSB to generate the codewords "01111" and "10010" corresponding to the LSB.

FIG. 9 illustrates an example of a codeword of FIG. 8 flipped by the memory device 100 of FIG. 1.

Flipping may include inverting at least one bit of a codeword. For example, the memory device 100 may flip codeword "10011" to generate codeword "01100," corresponding to an MSB. The memory device 1001 may flip codeword "110010" to generate codeword "00101," corresponding to an LSB.

The memory device 100 may program the flipped codewords to a plurality of multi-bit cells based on the example embodiment of FIG. 2.

In FIG. 9, in a cell 1, since the MSB "1" and LSB "1" are stored, a program state P0 may be formed. In the same manner, program states P2, P2, P1, P2, P2, P1, P0, P2, and P3 may be formed in cells 2 to 10, respectively. In FIG. 9, program state P0 and P3 are not formed in neighboring cells.

It is assumed that a probability that a data value is zero or one may respectively be ½ (=0.5). When an RLL code is not used, a probability that P0 and P3 are formed in neighboring cells may be ¼ (=0.25).

A probability that P0 and P3 are formed in the neighboring cells in example embodiments of FIGS. 7 to 9 is 17/128 (=0.1328125).

A probability that P0 and P3 are formed in the neighboring cells in example of FIGS. 4 to 6 is 0.

The memory device 100 may determine, for example, whether to apply a (0, 2) RLL code and flipping or to apply (1, ∞) RLL code based on a probability of occurrence of lateral charge spreading and code rate.

The code rate in the example embodiments of FIGS. 7 to 9 is 0.8 and the code rate in the example embodiments of FIGS. 4 to 6 is 0.6.

According to example embodiments, the memory device 100 may use an encoding scheme based on at least one modulation coding including NRZ (Non Return to Zero), NRZ-L, NRZ-M, NRZ-S, RZ (Return to Zero), unipolar RZ, bipolar RZ, RZ-AMI, Bi-Φ-L (Manchester coding), Bi-Φ-M, Bi-Φ-S, delay modulation, and the like.

Figure 10:
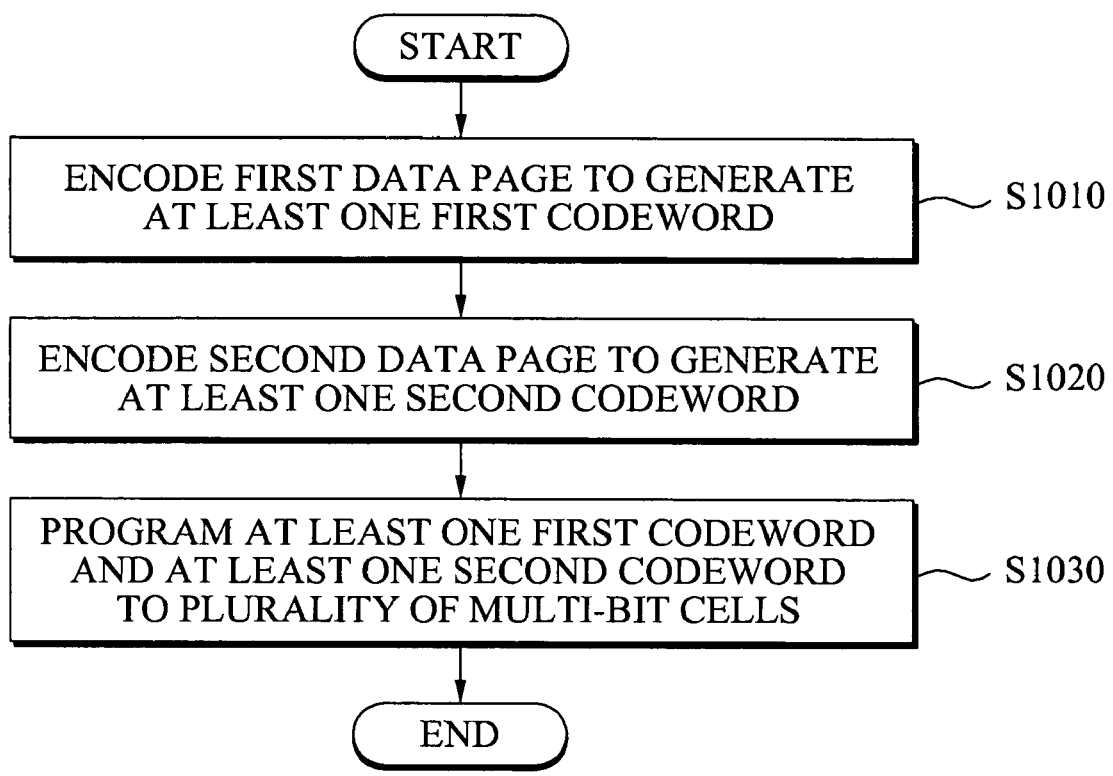
FIG. 10 is a flowchart illustrating a method of programming memory data according to example embodiments.

FIG. 10 is a flowchart illustrating a method of programming memory data according to example embodiments.

Referring to FIG. 10, a programming method may encode a first data page to generate at least one first codeword in operation S1010. In this instance, the at least one first codeword may have at least one of a first maximum value of a number of successive ones and a second maximum value of a number of successive zeros.

The at least one first codeword may have at least one of a first minimum value of a number of successive ones and a second minimum value of a number of successive zeros.

The programming method may encode a second data page to generate at least one second codeword in operation S1020.

The programming method may encode the second data page to generate the at least one second codeword with at least one of a third maximum value of a number of successive ones and a fourth maximum value of a number of successive zeros.

The programming method may program the at least one first codeword and the at least one second codeword to a plurality of multi-bit cells in operation S1030.

For example, the programming method may generate at least one third codeword by flipping the at least one first codeword. In this instance, the method of programming may program a third data page to the plurality of multi-bit cells instead of the first data page.

The memory data programming method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Example embodiments may be applicable to a memory device that stores data by changing a threshold of a memory cell. Examples of the memory device may include a flash memory, Electrically Erasable Programmable Read only Memory (EEPROM), Phase Shift Random Access Memory (PRMA), and Magnetic Random Access Memory (MRAM), and the like.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and the memory controllers may constitute memory cards. The memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), Integrated Drive Electronics (IDE), and the like.

The flash memory devices may be non-volatile memory devices that may maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
   a memory cell array including a plurality of multi-bit cells;
   an encoder configured to encode a first data page for generating at least one first codeword with at least one of a first maximum value of a number of successive ones and a second maximum value of a number of successive zeros, and to encode a second data page for generating at least one second codeword; and
   a programming unit configured to program the at least one first codeword and the at least one second codeword to the plurality of multi-bit cells.

2. The memory device of claim 1, wherein the encoder encodes the first data page to generate the at least one first codeword with a first minimum value of a number of successive zeros and the second maximum value of a number of successive zeros.

3. The memory device of claim 1, wherein the encoder divides the second data page to generate a plurality of second codewords and increases a code rate in association with the at least one first codeword and the plurality of second codewords.

4. The memory device of claim 1, wherein the encoder encodes the second data page to generate the at least one second codeword with at least one of a third maximum value of a number of successive ones and a fourth maximum value of a number of successive zeros.

5. The memory device of claim 1, wherein the encoder flips the at least one codeword to generate at least one third codeword, with the flipping including inverting at least one bit of the at least one first codeword, and the programming unit programs the at least one third codeword and the at least one second codeword to the plurality of multi-bit cells.

6. The memory device of claim 1, wherein the encoder encodes the first data page according to an encoding scheme corresponding to a (d, k) Run-Length Limited (RLL) code, the d being a minimum value of a number of successive zeros between two ones, and the k being a maximum value of a number of successive zeros between two ones.

7. The memory device of claim 1, wherein each of the plurality of multi-bit cells respectively stores m-bit data, m being a natural number equal to or more than two, and the encoder generates a symbol respectively from the m-bit data stored in each of the plurality of multi-bit cells and applies a $2^m$-ary Run-Length Limited (RLL) code to the symbol to generate the at least one codeword.

8. The memory device of claim 1, wherein each of the multi-bit cells includes a charge trap site, and the programming unit changes a threshold voltage of each of the plurality of multi-bit cells by charging or discharging the charge trap site with an electric charge.

9. The memory device of claim 1, wherein the programming unit determines a threshold voltage of one of the plurality of multi-bit cells based on a combination of one bit of the first codeword and one bit of the second codeword.

10. A method of programming memory data, comprising:
    encoding a first data page to generate at least one first codeword with at least one of a first maximum value of a number of successive ones and a second maximum value of a number of successive zeros;
    encoding a second data page to generate at least one second codeword; and
    programming the at least one first codeword and the at least one second codeword to a plurality of multi-bit cells.

11. The method of claim 10, wherein the encoding the first data page includes generating the at least one first codeword with a first minimum value of a number of successive zeros and the second maximum value of a number of successive zeros.

12. The method of claim 10, wherein the encoding the second data page includes dividing the second data page to generate a plurality of second codewords.

13. The method of claim 10, wherein the encoding the at least one second codeword includes generating the at least one second codeword with at least one of a third maximum value of a number of successive ones and a fourth maximum value of a number of successive zeros.

14. The method of claim 10, further comprising:
flipping the at least one first codeword to generate at least one third codeword, the flipping including inverting at least one bit of the at least one first codeword,
wherein the programming programs the at least one third codeword and the at least one second codeword to the plurality of multi-bit cells.

15. The method of claim 10, wherein the encoding the first data page includes generating the at least one first codeword according to an encoding scheme corresponding to a (d, k) Run-Length Limited (RLL) code, the d being a minimum value of a number of successive zeros between two ones, and the k being a maximum value of a number of successive zeros between two ones.

16. The method of claim 10, wherein the programming includes storing m-bit data to at least one of the plurality of multi-bit cells, m being a natural number equal to or more than two, and at least one of the encoding the first data page and encoding the second data page includes generating a symbol respectively from the m-bit data stored in at least one of the plurality of multi-bit cells and applying a $2^m$-ary Run-Length Limited (RLL) code to the symbol to generate at least one of the at least one first codeword and at least one second codeword.

17. The method of claim 10, wherein the programming changes a threshold voltage of each of the plurality of multi-bit cells by charging or discharging a charge trap site with an electric charge, with each of the plurality of multi-bit cells respectively storing the charge trap site.

18. The method of claim 10, wherein the programming determines a threshold voltage of one multi-bit cell from among the plurality of multi-bit cells based on a combination of one bit of the first codeword and one bit of the second codeword.

19. A computer-readable medium storing a program for implementing the method of claim 10.

* * * * *